(12) United States Patent
Kim

(10) Patent No.: US 6,346,823 B1
(45) Date of Patent: Feb. 12, 2002

(54) PULSE GENERATOR FOR PROVIDING PULSE SIGNAL WITH CONSTANT PULSE WIDTH

(75) Inventor: Seok-Tae Kim, Ichon-shi (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/717,379

(22) Filed: Nov. 22, 2000

(30) Foreign Application Priority Data

Nov. 22, 1999 (KR) .............................. 99-51806

(51) Int. Cl.[7] .......................................... H03K 19/003
(52) U.S. Cl. ........................ 326/29; 326/98; 327/172; 327/175
(58) Field of Search ............................ 326/29, 95, 96, 326/99, 108; 327/175, 176, 172, 198, 298

(56) References Cited

U.S. PATENT DOCUMENTS

| | | | | |
|---|---|---|---|---|
| 3,783,304 A | * | 1/1974 | Fox | 307/106 |
| 4,710,904 A | * | 12/1987 | Suzuki | 365/226 |
| 4,757,214 A | * | 7/1988 | Kobayashi | 307/265 |
| 4,767,947 A | * | 8/1988 | Shah | 307/265 |
| 5,696,463 A | * | 12/1997 | Kwon | 327/172 |
| 5,841,306 A | * | 11/1998 | Lim | 327/228 |

* cited by examiner

*Primary Examiner*—Michael Tokar
*Assistant Examiner*—Khai Nguyen
(74) *Attorney, Agent, or Firm*—Pillsbury Winthrop LLP

(57) ABSTRACT

A pulse generator for providing a pulse signal with a constant pulse width. An edge detection unit, coupled between a node and a ground terminal, detects an edge of an external clock to set a node to a predetermined level. A delay unit selectively delays the voltage level of the node according to the voltage level of the node. A post-charge unit charges the node to in response to an output of the delay unit. An input control unit controls the transferring of the next external clock according to the output of the delay unit and the external clock. An output unit receives the voltage level of the node to generate the pulse signal.

13 Claims, 5 Drawing Sheets

US 6,346,823 B1

PULSE GENERATOR FOR PROVIDING PULSE SIGNAL WITH CONSTANT PULSE WIDTH

BACKGROUND OF THE INVENTION

1. Field of the Invention

The present invention relates to a semiconductor device; and, more particularly, to a pulse generator for providing a pulse signal with a constant pulse width regardless of variations in a pulse width and period of an external clock.

2. Description of Related Art

Generally, a pulse generator is widely used in a synchronous memory device such as a synchronous dynamic random access memory (SDRAM) operating in synchronization with an external clock.

FIG. 1 (Prior Art) is a schematic diagram showing a conventional pulse generator 10, and FIG. 2 is a timing diagram explaining the operation of pulse generator 10 shown in FIG. 1.

Pulse generator 10 includes an inverter INV11 for inverting an external clock CLK_IN to generate an inverted clock, a delay unit 110 for delaying the inverted clock for a predetermined time and an output unit 120 for receiving the external clock CLK_IN and an output of the delay unit 110 to generate a pulse signal CLK_OUT. The pulse signal CLK_OUT has a pulse width corresponding to the predetermined time.

When a logic high period of the external clock CLK_IN is shorter than a delay period of the delay unit 110, a pulse width of the pulse signal CLK_OUT gets also short.

Accordingly, since the pulse width of the pulse signal is changed according to the pulse width and period of the external clock CLK_IN, it is difficult to achieve stable operation of internal circuits.

SUMMARY OF THE INVENTION

This invention provides a pulse generator for generating a pulse signal having a constant pulse width regardless of variations in a pulse width and period of an external clock.

In accordance with an aspect of the present invention, there is provided a pulse generator for providing a pulse signal with a constant pulse width. An an edge detection means, coupled between a node and a ground terminal, detects an edge of an external clock to set a node to a predetermined level. A delay means selectively delays the voltage level of the node according to the voltage level of the node. A post-charge means charges the node in response to an output of the delay means. An input control means controls the transfer of a next external clock according to the output of the delay means and the external clock. An output means receives the voltage level of the first node and generates the pulse signal.

BRIEF DESCRIPTION OF THE DRAWINGS

Other objects and aspects of the invention will become apparent from the following description of the embodiments with reference to the accompanying drawings, in which.

DETAILED DESCRIPTION

Figure 1:
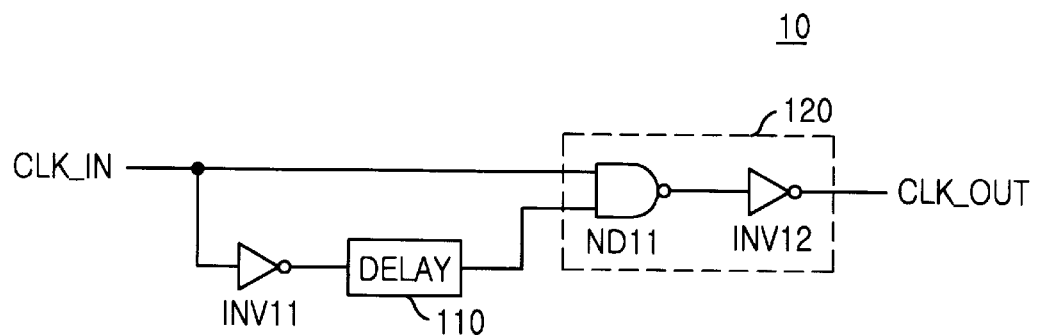
FIG. 1 (Prior Art) is a schematic diagram showing a conventional pulse generator.
Figure 2:
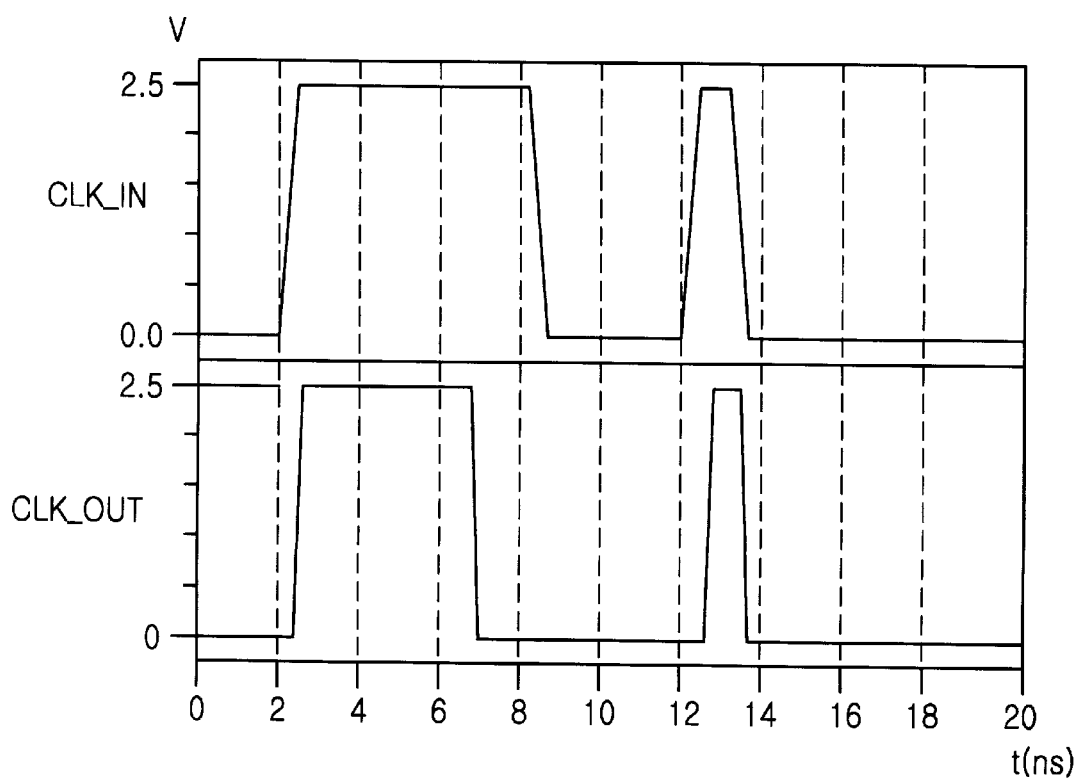
FIG. 2 (Prior Art) is a timing diagram explaining the operation of the conventional pulse generator shown in FIG. 1.
Figure 3:
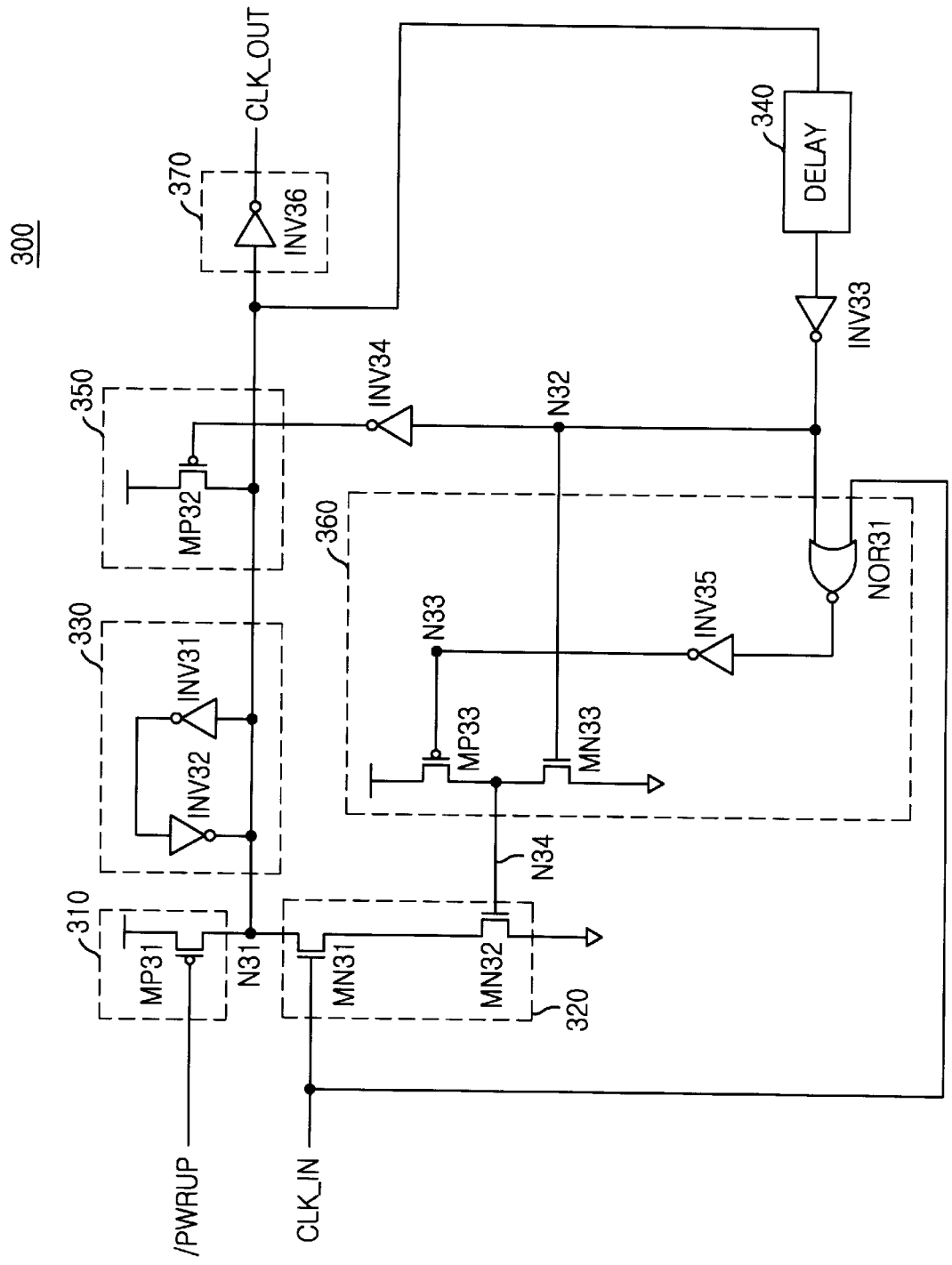
FIG. 3 is a schematic diagram illustrating a pulse generator in accordance with an embodiment of the present invention.
Figure 4:
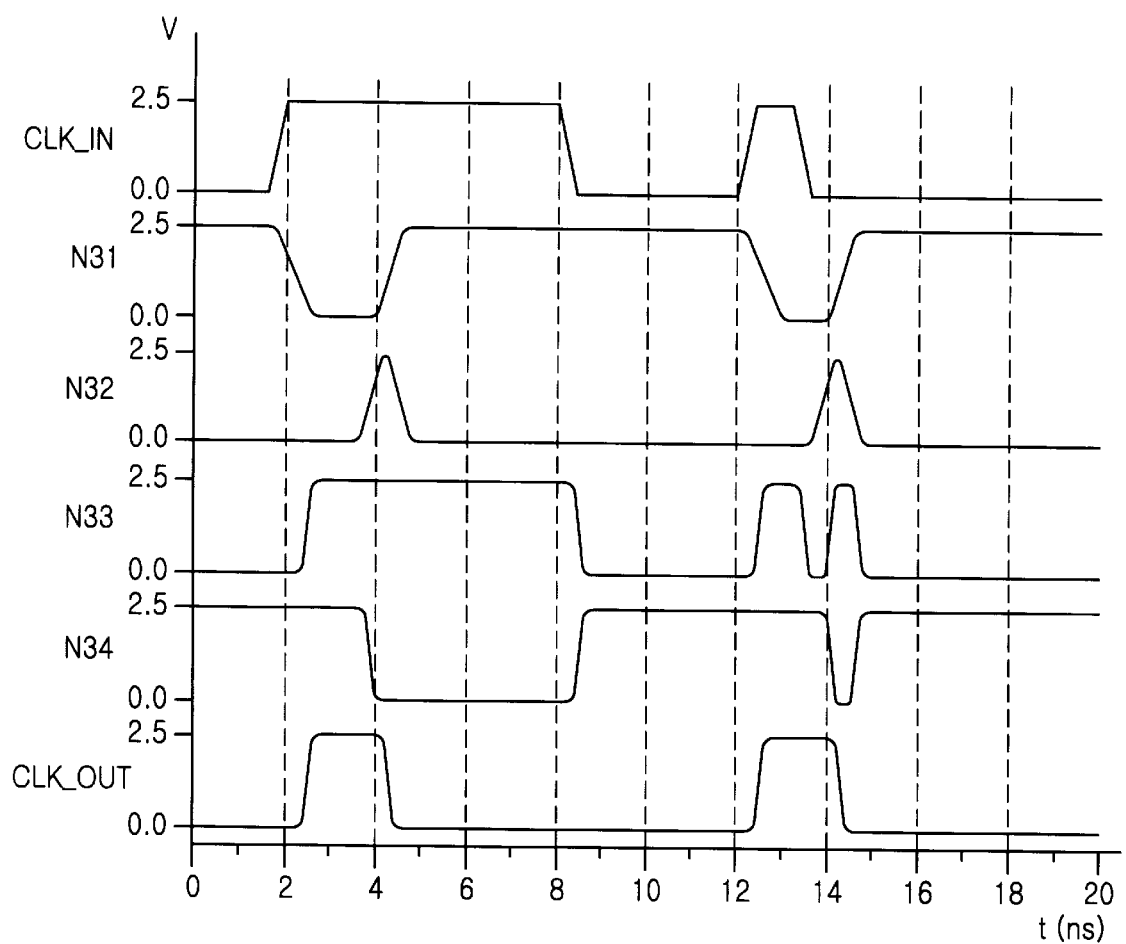
FIG. 4 is a timing diagram explaining the operation of the pulse generator shown in FIG. 3.

FIG. 3 is a schematic diagram illustrating a pulse generator in accordance with an embodiment of the present invention. The pulse generator 300 includes an initial control unit 310, an edge detection unit 320, a latch unit 330, a delay unit 340, a post-charge unit 350, an input control unit 360 and an output unit 370.

The initial control unit 310 determines an initial state of a node N31 in response to a power-up signal/PWRUP. The power-up signal/PWRUP represents a control signal that is activated when a power is on. The initial control unit 310 is implemented with a PMOS transistor MP31, coupled between a power terminal VDD and the node N31, whose gate receives the power-up signal/PWRUP.

The edge detection unit 320 detects a rising edge of an external clock CLK_IN. The edge detection unit 320 is implemented with NMOS transistors MN31 and MN32. The NMOS transistors MN31 and MN32 are serially coupled between the node N31 and a ground terminal GND. The external clock CLK_IN is inputted to a gate of the NMOS transistor MN31.

The latch unit 330 latches a voltage level of the node N31. The latch unit 330 is implemented with an inverter INV51 whose input terminal is coupled to the node N31, and an inverter INV52 whose input terminal is coupled to an output terminal of the inverter INV51 and whose output terminal is coupled to the node N31.

The delay unit 340 selectively performs a delay operation according to a voltage level of the node N31. That is, only when the voltage level of the node N31 is a logic low, the delay unit 340 delays the voltage level of the node N31 for a predetermined time. When the voltage level of the node N31 is a high level, the delay unit 340 immediately outputs the voltage level of the node N31 to an exterior without any delay.

After the initial state is determined, the post-charge unit 350 charges the node N31 to a predetermined voltage level in response to an output of the delay unit 340. The post-charge unit 350 is implemented with a PMOS transistor MP32, coupled between the power terminal VDD and the node N31, whose gate receives the output of the delay unit 340. Inverters INV32 and INV33 invert and buffer the output of the delay unit 340, respectively.

The input control unit 360 controls an operation of transferring next external clock according to the output of the delay unit 340 and the external clock. The input control unit 360 includes: a NOR gate NOR31 for NORing the external clock CLK_IN and an output of the inverter INV33; an inverter INV35 for inverting an output of the NOR gate NOR31; a PMOS transistor MP33, coupled between the power terminal VDD and a node N34, whose gate receives an output of inverter INV35; and an NMOS transistor MN33, coupled between the node N34 and the ground terminal GND, whose gate receives the output of the inverter INV33. The voltage level of the node N34 is inputted to a gate of the NMOS transistor MN32 contained in the edge detection unit 320.

The output unit 370 receives the voltage level of the node N31 and outputs the pulse signal CLK_OUT having a predetermined pulse width. The output unit 370 is implemented with an inverter INV36.

As an alternative, edge detection unit 320 for detecting the rising edge of the external clock CLK_IN, can be implemented with an edge detection unit for detecting a falling edge of the external clock CLK_IN. Also, as an alternative, delay unit 340 which performs the delay operation in response to the low level of the node N31, can be implemented with a delay unit for performing the delay operation in response to a high level of the node N31.

Figure 5:
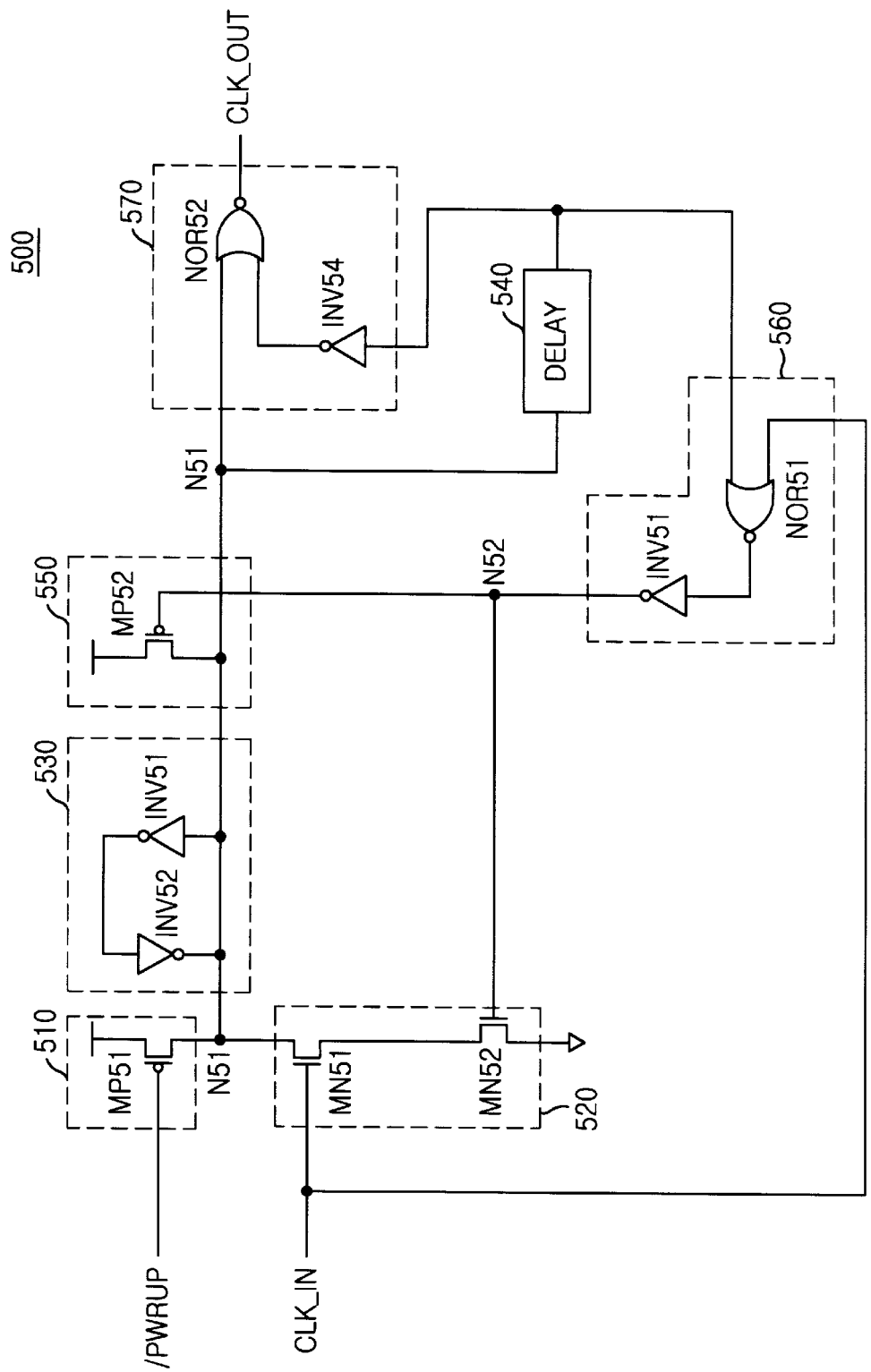
FIG. 5 is a schematic diagram illustrating a pulse generator in accordance with another embodiment of the present invention.
Figure 6:
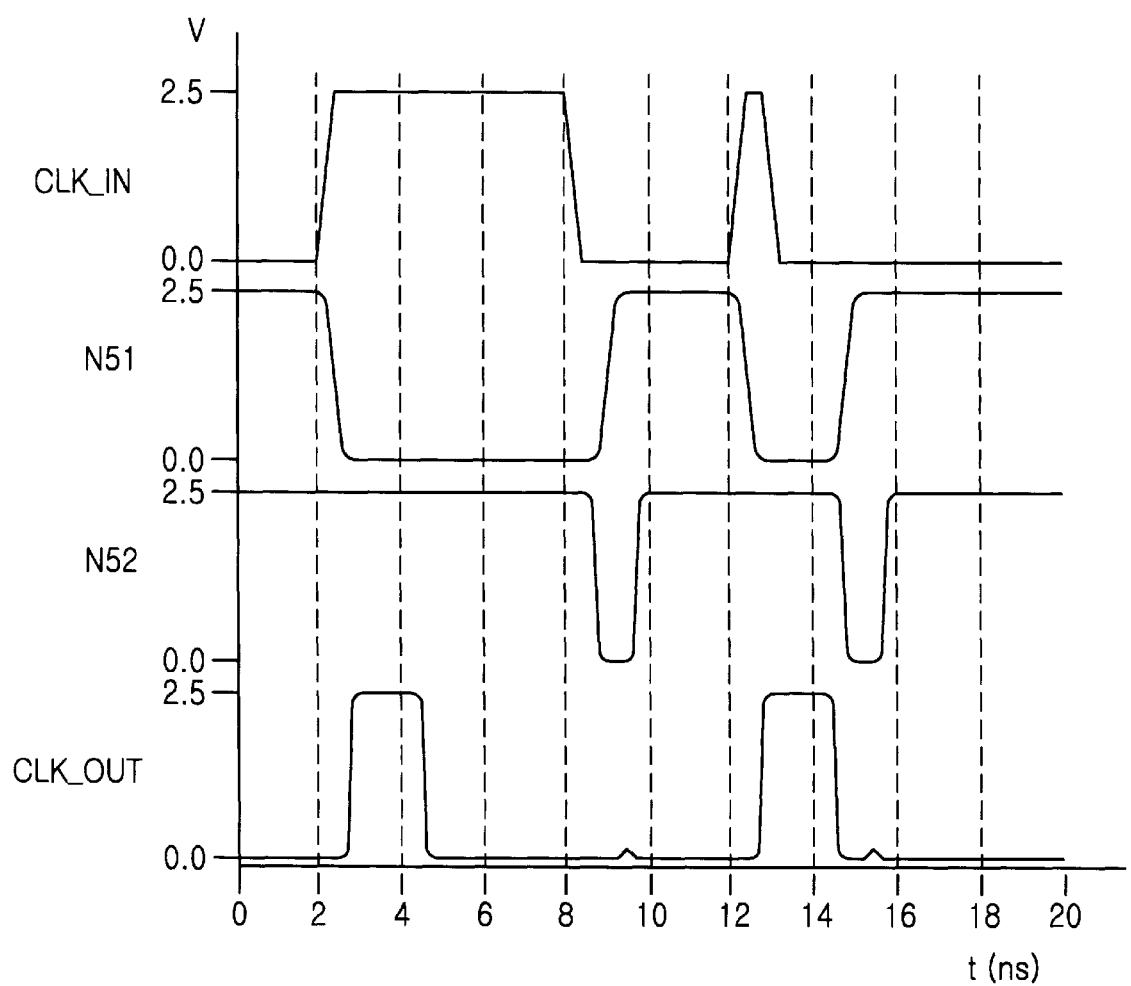
FIG. 6 is a timing diagram explaining the operation of the pulse generator shown in FIG. 5.

FIG. 6 is a timing diagram explaining the operation of the pulse generator 300 shown in FIG. 5.

Hereinafter, an operation of the pulse generator 300 in accordance with an embodiment of the present invention will be described with reference with FIGS. 5 and 6.

First, when the external clock CLK_IN is maintained in a low level and the power-up signal/PWRUP is changed from a low level to a high level, the nodes N31, N32, N33 and N34 become a high level, a low level, a low level and a high level, respectively. Accordingly, the pulse signal CLK_OUT is a low level.

Then, when the external clock CLK_IN is changed to a high level, the NMOS transistors MN31 and MN32 are turned on so that the node N31 is changed from a high level to a low level. Thus, the pulse signal CLK_OUT is set to a high level.

At this time, since the node N31 is a high level, the delay unit 340 transfers the high level of the node N31 without any delay. As a result, since the nodes N32 and N33 become a low level and a high level, respectively, the node N34 maintains a floating state, so that the voltage level of the node N31 can be maintained constantly without any influence of external factors such as noises.

When a logic high period of the external clock CLK_IN is longer than a delay period of the delay unit 340, the delay unit 340 delays the low level of the node N31 for a predetermined time, so that the nodes N32 becomes a high level and the NMOS transistor MN33 is turned on. Thus, the node N34 becomes a low level and the NMOS transistor MN32 is turned off. Meanwhile, the PMOS transistor MP32 contained in the post-charge unit 350 is turned on and the node N31 is set to a high level, thereby outputting the pulse signal of a low level.

Because the delay unit 340 outputs the high level of the node N31 without any delay operation, the node N32 is immediately changed to a low level. Therefore, the NMOS transistor MN33 and the PMOS transistor MP32 are turned off.

Next, when the external clock CLK_IN is changed to a low level, the node N33 is changed to a low level so that the PMOS transistor MP33 is turned on. As a result, the node N34 is changed to a high level and the NMOS transistor MN32 is turned on, so that the pulse generator 300 is set to a standby state for next external clock.

At this time, the pulse generator 300 can receive a next external clock when the external clock CLK_IN again changes from a low level to a high level. Therefore, the pulse generator 300 generates the pulse signal only one time even when the external clock has a long logic high period.

Hereinafter, an operation of the pulse generator 300 will be described in case where the logic high period of the external clock CLK IN is relatively short compared with the delay period of the delay unit 340.

When the external clock CLK_IN is changed to a low level, there is no change in the voltage level of the node N31 since the NMOS transistor MN31 is turned off. Additionally, since the external clock CLK IN is inputted to one input terminal of the NOR gate NOR31, the voltage level of the node N33 is changed depending on the level transition of the node N32.

After the external clock CLK_IN is changed to a low level, the low level of the node N31 is delayed via the delay unit 340 so that the node N32 becomes a high level. Thus, the NMOS transistor MN53 is turned on and the node N34 is set to a low level. As a result, the NMOS transistor MN32 is turned off and the node N33 is simultaneously set to a high level.

Meanwhile, the high level of the node N32 is passed through the inverter INV34 to enable the post-charge unit 350. That is, the PMOS transistor MP32 is turned on so that the node N31 is set to a high level. Then, the pulse signal CLK_OUT is outputted in a low level via the inverter INV36.

At this time, since the node N31 is a high level, the delay unit 340 transfers the high level of the node N31 without any delay, to thereby setting the node N32 to a low level immediately. Thus, the NMOS transistor MN33 and the PMOS transistor MP32 are turned off. Additionally, the PMOS transistor MP33 is turned on so that the node N34 is set to a high level. Consequently, by turning on the NMOS transistor MN32, the pulse generator 300 is set to a standby state for a next external clock.

Accordingly, even when the high level period of the external clock CLK_IN is relatively shorter than the delay period of the delay unit 340, the pulse generator 300 can generate the pulse signal having a constant pulse width.

FIG. 5 is a schematic diagram of a pulse generator 500 in accordance with another embodiment of the invention. Pulse generator 500 includes an initial control unit 510, an edge detection unit 520, a latch unit 530, a delay unit 540, a post-charge unit 550, an input control unit 560 and an output unit 570. The pulse generator 500 has the same structure as the pulse generator shown in FIG. 3 except for the input control unit 520 and the output unit 570.

The input control unit 560 includes a NOR gate NOR51 for NORing an external clock CLK_IN and an output of the delay unit 540, and an inverter INV51 for inverting an output of the NOR gate NOR51. At this time, an output of the inverter INV51 is inputted to a gate of an NMOS transistor MN52 contained in the edge detection unit 520 and a gate of the PMOS transistor MP52 contained in the post-charge unit 550.

The output unit 570 includes an inverter INV54 for inverting the output of the delay unit 540 and a NOR gate NOR52 for NORing a voltage level of a node N51 and an output of the inverter INV54 to generate the pulse signal CLK_OUT.

FIG. 6 is a timing diagram explaining the operation of pulse generator 500 shown in FIG. 5. The operation of the pulse generator 500 is similar to that of pulse generator 300 shown in FIG. 3. Therefore, for the sake of convenience, a detailed description of the operation of the pulse generator 500 will be omitted.

As described above, the pulse generator in accordance with the present invention provides the pulse signal having a constant pulse width regardless of variations in the pulse width and period of the external clock, thereby securing a stable operation to semiconductor integrated circuits.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A pulse generator for providing a pulse signal with a constant pulse width, comprising:
   an edge detection means, coupled to a node, for detecting an edge of an external clock to set a node to a predetermined level;
   a delay means for selectively delaying the voltage level of the node according to the voltage level of the node;
   a post-charge means for charging the node in response to an output of the delay means;
   an input control means for controlling an operation of transferring next external clock according to the output of the delay means and the external clock; and
   an output means for receiving the voltage level of the node to generate the pulse signal.

2. The pulse generator as recited in claim 1, wherein the edge detection means detects a rising edge of the external clock.

3. The pulse generator as recited in claim 2, wherein the delay means performs a delay operation only when a voltage level of the node is a low level.

4. The pulse generator as recited in claim 1, further comprising an initial control means, coupled between a power terminal and the node, for determining an initial level of the node in response to a control signal.

5. The pulse generator as recited in claim 4, wherein the control signal is a power-up signal, which is activated when power is applied to the pulse generator.

6. The pulse generator as recited in claim.4 further comprising a latch means, coupled to the node, for latching a voltage level of the node.

7. The pulse generator as recited in claim 5, wherein the initial control means is a PMOS transistor, coupled between the power terminal and the node, whose gate receives the power-up signal.

8. The pulse generator as recited in claim 7, wherein the edge detection means includes:

a first NMOS transistor having a drain coupled to the node and a gate receiving the external clock; and a second NMOS transistor having a drain coupled to a drain of the first NMOS transistor, a source coupled to the ground terminal and a gate receiving an output of the input control means.

9. The pulse generator as recited in claim 8, wherein the input control means includes:
   a NOR gate for NORing an inverted output of the delay means and the external clock;
   an inverter for inverting an output of the NOR gate;
   a second PMOS transistor having a source coupled to the power terminal and a gate receiving an output of the inverter; and
   a third NMOS transistor having a drain coupled to a drain of the second PMOS transistor, a source coupled to the ground terminal and a gate receiving the inverted output of the delay means.

10. The pulse generator as recited in claim 9, wherein the post-charge means is a third PMOS transistor, coupled between the power terminal and the node, whose gate receives the output of the delay means.

11. The pulse generator as recited in claim 10, wherein the output means is a second inverter having an input terminal coupled to the node and an output terminal outputting the pulse signal.

12. The pulse generator as recited in claim 4, wherein the input control means includes:
   a NOR gate for NORing an output of the delay means and the external clock; and
   an inverter for inverting an output of the delay means.

13. The pulse generator as recited in claim 12, wherein the output means includes:
   a second inverter for inverting an output of the delay means; and
   a second NOR gate for NORing an output of the second inverter and a voltage level of the node.

* * * * *